(12) United States Patent
Yasui

(10) Patent No.: US 7,551,449 B2
(45) Date of Patent: Jun. 23, 2009

(54) FLEXIBLE CIRCUIT BOARD, ELECTRONIC CIRCUIT DEVICE, AND MOBILE COMMUNICATION TERMINAL

(75) Inventor: Kenichiro Yasui, Tokyo (JP)

(73) Assignee: NEC Corporation, Tokyo (JP)

(*) Notice: Subject to any disclaimer, the term of this patent is extended or adjusted under 35 U.S.C. 154(b) by 265 days.

(21) Appl. No.: 11/299,816

(22) Filed: Dec. 13, 2005

(65) Prior Publication Data
US 2006/0128346 A1 Jun. 15, 2006

(30) Foreign Application Priority Data
Dec. 13, 2004 (JP) .............................. 2004-359728

(51) Int. Cl.
*H05K 1/00* (2006.01)

(52) U.S. Cl. .................. 361/749; 361/694; 361/796; 361/803; 361/804; 257/686

(58) Field of Classification Search ................. 361/749, 361/794, 796, 803, 804; 257/686
See application file for complete search history.

(56) References Cited

U.S. PATENT DOCUMENTS

| 4,227,788 A | 10/1980 | Shimizu et al. | |
|---|---|---|---|
| 4,845,315 A * | 7/1989 | Stopper | 361/827 |
| 4,990,948 A | 2/1991 | Sasaki et al. | |
| 5,181,065 A | 1/1993 | Hara | |
| 5,276,418 A | 1/1994 | Klosowiak et al. | |
| 6,307,751 B1 * | 10/2001 | Bodony et al. | 361/749 |
| 6,447,314 B1 * | 9/2002 | Kato et al. | 439/165 |
| 6,469,377 B1 * | 10/2002 | Kondo | 257/686 |
| 7,091,665 B2 * | 8/2006 | Nomoto et al. | 313/583 |
| 2001/0047127 A1 * | 11/2001 | New et al. | 600/300 |
| 2002/0167081 A1 * | 11/2002 | Kondo | 257/686 |
| 2002/0187803 A1 | 12/2002 | Nakamura et al. | |
| 2003/0061696 A1 | 4/2003 | Staiger | |
| 2003/0202031 A1 * | 10/2003 | Nakamura | 347/20 |
| 2004/0021792 A1 * | 2/2004 | Yasui | 348/373 |
| 2004/0099938 A1 * | 5/2004 | Kang et al. | 257/686 |
| 2004/0141028 A1 * | 7/2004 | Nakamura | 347/50 |
| 2004/0228038 A1 * | 11/2004 | Nakamura et al. | 360/264.2 |
| 2005/0007354 A1 * | 1/2005 | Yamada | 345/204 |
| 2005/0259387 A1 * | 11/2005 | Sung et al. | 361/681 |

FOREIGN PATENT DOCUMENTS

| JP | 6-48321 A | 6/1994 |
|---|---|---|
| JP | 2001-358422 A | 12/2001 |
| JP | 2004-64575 A | 2/2004 |

* cited by examiner

*Primary Examiner*—Dean A. Reichard
*Assistant Examiner*—Xiaoliang Chen
(74) *Attorney, Agent, or Firm*—Sughrue Mion, PLLC

(57) ABSTRACT

The flexible circuit board according to the present invention includes a plurality of mounting portions which are mounted with electronic circuits respectively, a connector portion that performs signal transmission between the electronic circuit mounted on each of the mounting portions and the electronic circuit device, and coupling portions that couple the respective mounting portions to the connector portion in different directions. The flexible circuit board is mounted on the electronic circuit device in a state of being folded at a predetermined part of one of the coupling portions.

9 Claims, 3 Drawing Sheets

FLEXIBLE CIRCUIT BOARD, ELECTRONIC CIRCUIT DEVICE, AND MOBILE COMMUNICATION TERMINAL

BACKGROUND OF THE INVENTION

1. Field of the Invention

The present invention relates to a flexible circuit board, and more particularly to a flexible circuit board provided with a plurality of electronic circuit mounting portions and to an electronic circuit device and a mobile communication terminal each including the flexible circuit board.

2. Description of the Related Art

An electronic component, which is included in an electronic circuit device in compact electronic equipment, such as a mobile phone, a video camera, and the like, is mounted on a circuit board through soldering or the like. The circuit board is generally made of organic composite materials. The outer size of mounted components is limited by a substrate size.

In recent years, there is a tendency in that the total size of mounted components is almost equal to an outer size of an electronic equipment in response to a demand for further reduction in size of the electronic equipment. Therefore, a space for receiving mounted components is becoming extremely small.

In view of this, there provides a technique in which electronic components are mounted on flexible boards so as to be put in a limited space in an electronic equipment.

For example, as to an electronic circuit device disclosed in JP2001-358422A, a plurality of circuit boards is electrically and mechanically connected with each other through a flexible board so as to receive a plurality of electronic circuits in a limited space in a cabinet of an electronic device. Further, the circuit boards are arranged in the electronic device in an overlapping manner by folding the flexible board at a predetermined part thereof. Thus, the electronic circuits can be mounted efficiently at high density in the electronic device.

Further, in a mobile communication terminal disclosed in JP2004-064575A, two camera units are mounted on the same flexible printed board. The flexible printed board is appropriately folded so that view-field directions of both the cameras are opposite to one another. Therefore, the flexible printed board as a control printed wiring board does not need to be mounted on each camera.

Moreover, in an attachment structure of a flexible circuit board disclosed in JP 06-048321 B, the flexible circuit board and a connector housing are collectively fixed by means of a same stopper. The stopper reliably establishes fixation of an intermediate portion of the flexible circuit board. This realizes the attachment structure of the flexible circuit board with stable fixation.

Now, a flexible board sometimes has a plurality of mounting portions, each of which is mounted with an electronic circuit including electronic components and is arranged toward different directions. For example, a flexible board may have two electronic circuit mounting portions arranged in perpendicular directions through a connector mounting portion which mounts a connector. In this arrangement, manufactures mount the connector mounting portion to a connector retaining portion on an electronic circuit device, after they mount the two electronic circuit mounting portions to the electronic circuit device first, and then, the flexible board is held on the electronic circuit device by each of the retaining portions. In this case, a certain force acts on the connector mounting portion in its rotational direction from the two mounted electronic circuit mounting portions, when manufactures mount the connector mounting portion to the connector retaining portion. The flexible board bends due to this force when manufactures mount the connector mounting portion to the connector retaining portion on the electronic circuit device. They may mount the flexible board to each of the retaining portions on the electronic circuit device while the flexible board bends. This may lead to deformation of a connector terminal.

Also, in the case where they first mount the connector mounting portion on the electronic circuit device ahead of mounting the two electronic circuit mounting portions, the force is generated in a certain direction with respect to the electronic circuit mounting portion which is mounted later. This force causes excessive deformation of the electronic circuit mounting portion. This is from the fact that the electronic circuit mounting portion is fitted into a claw-shape portion of the retaining portion of the electronic circuit device at an amount exceeding a predetermined fitting amount. As a result, the mounted components may be peeled off or damaged. Here, the above certain direction depends on the positions of the connector mounting portion and the previously mounted electronic circuit mounting portion and the length of the flexible board that connects the connector mounting portion with the electronic circuit mounting potions. Further, the direction varies in accordance with the lengths and shapes of the retaining portion of the electronic circuit device, electronic circuit mounting portions, and a flexible board.

As to the above-mentioned electronic circuit device disclosed in JP 2001-358422 A, the plurality of circuit boards are parallelly arranged to be mounted on the electronic circuit device by folding the flexible board at the predetermined part. However, as described above, it is not disclosed that the plurality of circuit boards are arranged to be mounted on the electronic circuit device in different directions, for example, perpendicular directions.

Further, JP 2004-064575 A discloses that the view-field directions of the two cameras are made opposite to each other by folding the flexible printed board. However, it is not disclosed that a plurality of cameras is arranged in different directions, for example, perpendicular directions, to be mounted on a mobile communication terminal.

Furthermore, JP 06-048321 U does not disclose that a plurality of circuit boards is arranged in different directions to be mounted on an electronic circuit device.

SUMMARY OF THE INVENTION

The present invention has been made in view of the above, and therefore has an exemplary feature to provide a flexible circuit board that can be easily mounted on a frame of an electronic circuit device without generating of torsion, peeling, and the like in electronic circuit mounting portions and a connector mounting portion irrespective of mounting order of the electronic circuit mounting portions and the connector mounting portion on the electronic circuit device.

The flexible circuit board according to the present invention includes a plurality of mounting portions which are mounted with electronic circuits respectively, a connector portion that performs signal transmission between the electronic circuit mounted on each of the mounting portions and the electronic circuit device and coupling portions that couple the respective mounting portions to the connector portion in different directions. The flexible circuit board is mounted on the electronic circuit device in a state of being folded at a predetermined part of one of the coupling portions.

The method of mounting a flexible circuit board according to the present invention that has a plurality of mounting portions which are mounted with electronic circuits respectively, a connector portion that performs signal transmission between the electronic circuit mounted on each of the mounting portions and the electronic circuit device, and coupling portions that couple the respective mounting portions to the connector portion in different directions, the method including the steps of, folding the flexible circuit board at a predetermined part of one of the coupling portions, and mounting the flexible circuit board on the electronic circuit device while moving the flexible circuit board in a rotational direction thereof with the predetermined part as a starting point.

With the above structure, the flexible circuit board of the present invention can be easily mounted on the frame without generating of torsion, peeling, and the like in the electronic circuit mounting portions and the connector mounting portion irrespective of the mounting order of the electronic circuit mounting portions and the connector mounting portion on the electronic circuit device.

BRIEF DESCRIPTION OF THE DRAWINGS

The above and other exemplary features, and advantages of the present invention will become more apparent from the following detailed description when taken in conjunction with the accompanying drawings wherein.

DETAILED DESCRIPTION OF THE EXEMPLARY EMBODIMENTS

Figure 1:
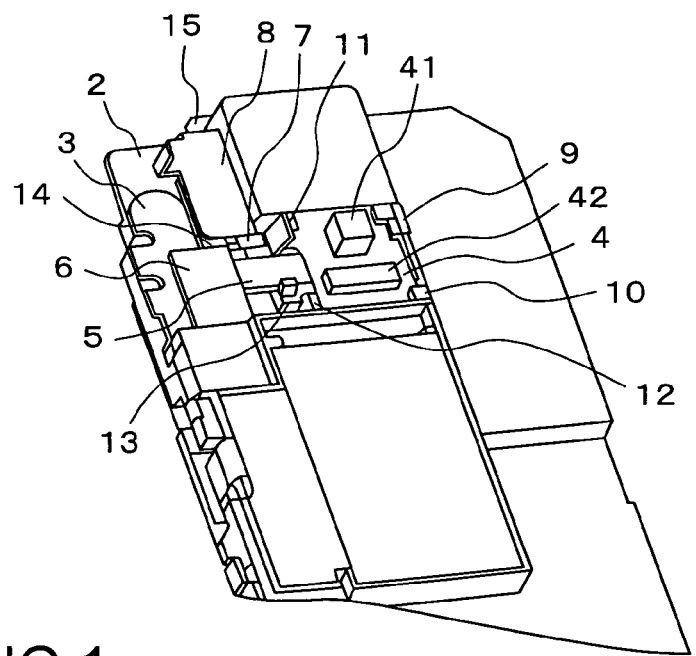
FIG. 1 is a perspective view of an electronic circuit device including a flexible circuit board in accordance with an exemplary embodiment of the present invention.
Figure 2:
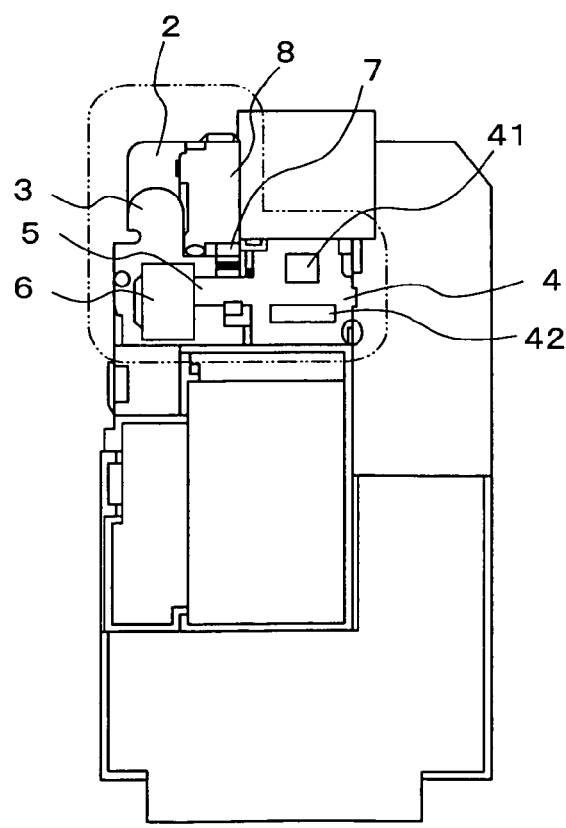
FIG. 2 is a plane view of the electronic circuit device including the flexible circuit board in accordance with the exemplary embodiment of the present invention.
Figure 3:
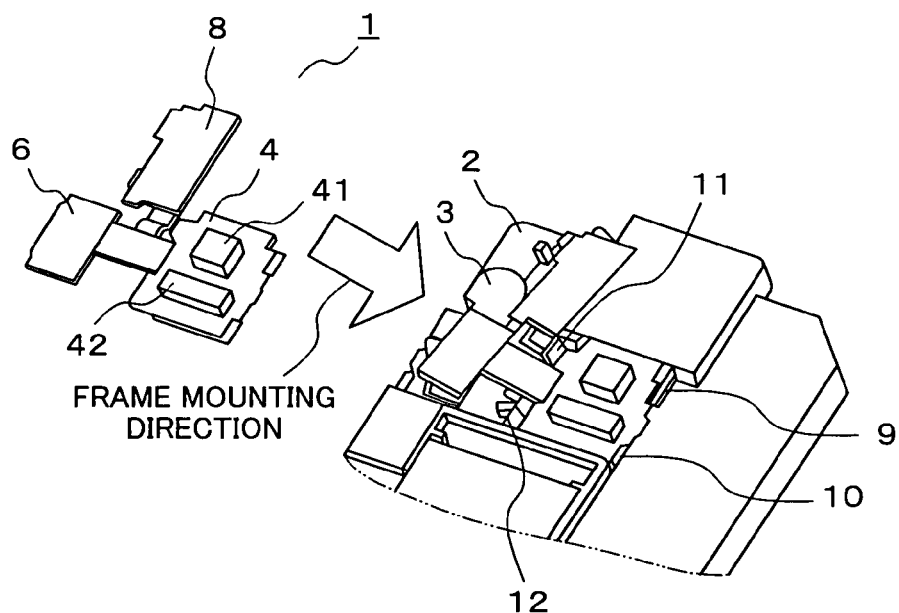
FIG. 3 is a perspective view in the case where the flexible circuit board is mounted on a frame.
Figure 4:
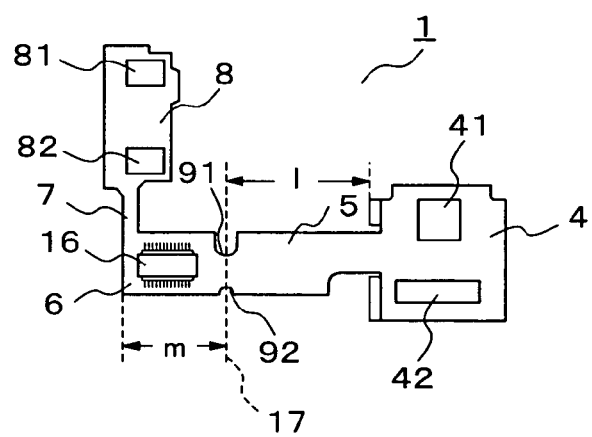
FIG. 4 is a plane view in a state in which the flexible circuit board is developed.
Figure 5:
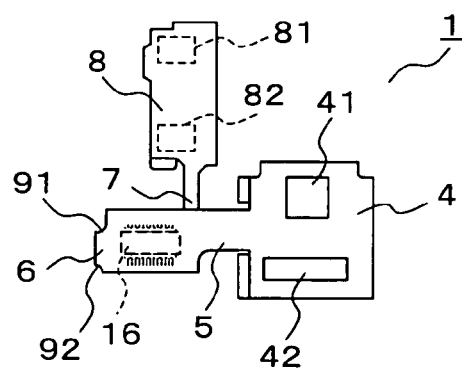
FIG. 5 is a plane view in a state in which the flexible circuit board is folded.

Next, exemplary embodiments according to the present invention will be described with reference to the drawings. FIG. 1 is a perspective view of an electronic circuit device using a flexible circuit board in accordance with the exemplary embodiment of the present invention. FIG. 2 is a plan view of FIG. 1. Further, FIGS. 4 and 5 each show the flexible circuit board in accordance with the exemplary embodiment of the present invention. FIG. 4 is a plan view showing the developed flexible circuit board, and FIG. 5 is a plan view showing a state in which the flexible circuit board is folded. The electronic circuit device includes a frame 2, a main circuit board 3 mounted on the frame 2, and a flexible circuit board 1 as shown in FIGS. 4 and 5, as shown in FIGS. 1 and 2.

In FIGS. 4 and 5, the flexible circuit board according to this exemplary embodiment includes a first mounting portion 4 mounted with an electronic circuit including electronic parts 41 and 42, a second mounting portion 8 mounted with an electronic circuit including electronic parts 81 and 82, a connector mounting portion 6 mounted with a connector 16 for establishing connection between the main circuit board 3 and the flexible circuit board 1, and coupling portions 5 and 7. The connector 16 is electrically connected to the electronic circuits, each of which includes the electronic components mounted on the flexible circuit board 1. The coupling portions 5 and 7 are made of flexible materials, and extend from the connector mounting portion 6 in different directions and directly connect with the first mounting portion 4 and the second mounting portion 8, respectively. For example, the coupling portion 5 may extend in a horizontal and in its longitudinal direction with respect to the connector mounting-portion 6 to be coupled with the first mounting portion 4. The coupling portion 7 may extend in a vertical and in its longitudinal direction with respect to the connector mounting portion 6 to be coupled with the second mounting portion 8. The coupling portion 5 has a wiring that transmits a signal from the connector mounting portion 16 to the electronic circuit in the first mounting portion 4, and the coupling portion 7 has a wiring that transmits a signal from the connector mounting portion 16 to the electronic circuit in the second mounting portion 8.

As shown in FIGS. 1 and 2, the frame 2 has claws 9, 10, 13, 14, and 15 for holding the first mounting portion 4 and the second mounting portion 8. Each of the claws has a mold-cutting or slanting structure, and is made of hard materials such as resin that makes the frame 2. Further, the connector mounting portion 6 is arranged at a portion where the board 3, which is mounted on the frame 2, is exposed. As described above, the first mounting portion 4 and the second mounting portion 8 are arranged in different directions each other, for example, the one is in a horizontal direction and the other is in a vertical direction with respect to the connector mounting portion 6.

As described above, the claws, which are made of hard materials such as resin, hold the first mounting portion 4 and the second mounting portion 8. Thus, there is a possibility that, when being inserted into the claws, the first mounting portion 4 and the second mounting portion 8 may deform, and thereby the mounted components thereon may be peeled off. Alternatively, the components mounted on the first or second mounting porton 4, 8 may be damaged because the flexible circuit board 1, which is mounted with the components thereon, may too bend. In order to prevent this, the flexible circuit board 1 according to the exemplary embodiment has coupling portion 5 and 7, and a bent portion 17.

As shown in FIGS. 4 and 5, the bent portion 17 serves as a boundary between the coupling portion 5 and the connector mounting portion 6. In this case, a length 1, which is a longitudinal length of the coupling portion 5, equals or longer than a length m, which is a longitudinal length of the connector mounting portion 6. Thus, when the flexible circuit board 1 is folded at the bent portion 17, the coupling portion 7 does not overlap with the first mounting portion 4 as shown in FIG. 5. That is, the coupling portion 7 is located between the connector mounting portion 6 overlapping with the coupling portion 5 and the first mounting portion 4. Note that both the end portions of the bent portion 17 are provided with notches 91 and 92 as shown in FIG. 4.

Figure 6:
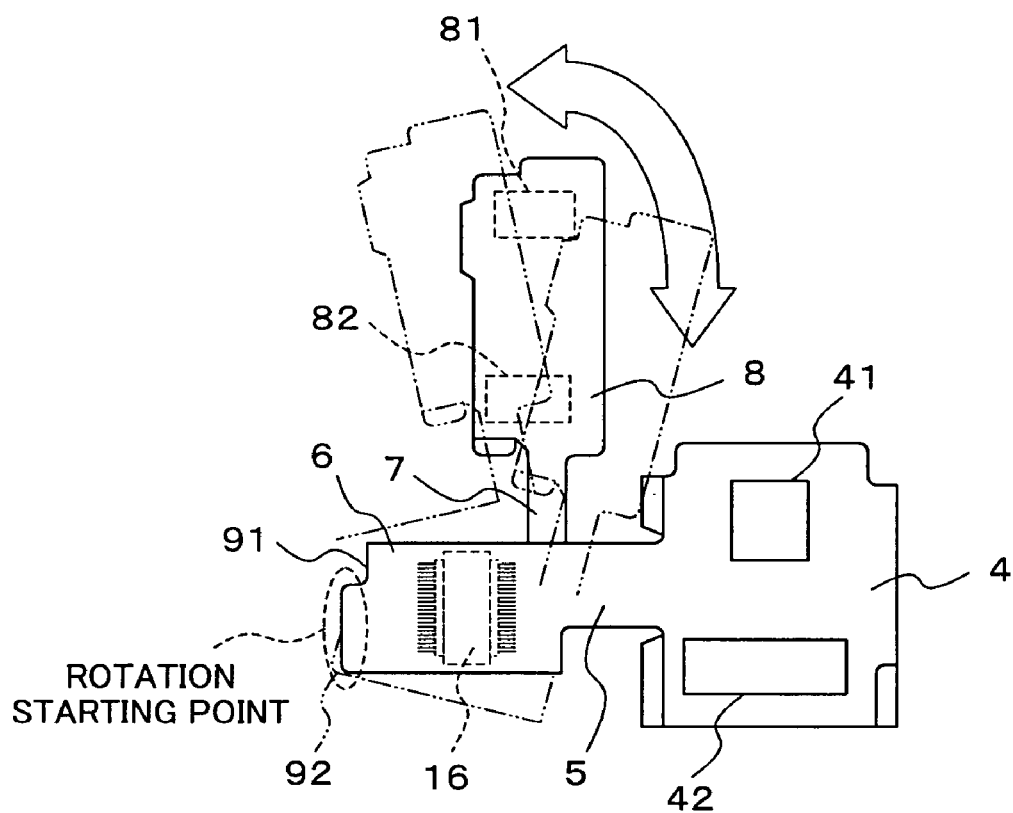
FIG. 6 is a view for explaining movement of the flexible circuit board in its rotational direction.

FIG. 6 is a view for explaining movement in a rotational direction of the flexible circuit board 1 folded as shown in FIG. 5. As shown in FIG. 6, the second mounting portion 8 is movable in its rotational direction in a range in which the coupling portion 5 overlaps with the connector mounting portion 6 with the bent portion 17 as a rotation starting point. As described above, both the end portions of the bent portion 17 are provided with the notches 91 and 92, whereby the second mounting portion 8 can move more freely around the bent portion 17. As a result, manufactures can mount the flexible circuit board 1 easily on the frame 2 (The details will be described later.).

Next, description will be made of a procedure of mounting the flexible circuit board 1 according to the exemplary embodiment on the frame 2 with reference to FIGS. 1 to 5.

First, the board 3 is mounted on the frame 2 in the electronic circuit device. Also, the connector 16 and necessary components are mounted on the first mounting portion 4, the second mounting portion 8, and the connector mounting portion 6 in the flexible circuit board 1. Subsequently, the flexible circuit board 1 is folded at the bent portion 17, result in that the connector 16 mounted on the connector mounting portion 6 and the components mounted on the second mounting portion 8 are positioned on the back side of the components mounted on the first mounting portion 4, as shown in FIG. 5.

Next, this folded flexible circuit board 1 is mounted on the frame 2 in accordance with the following procedure. Description will be made of the procedure of mounting the flexible circuit board 1 on the frame 2 with reference to FIG. 3. The flexible circuit board 1 folded in such a form as shown in FIG. 5 is inserted into the frame 2 in a direction indicated by an arrow shown in FIG. 3. Specifically, the first mounting portion 4 slides into the claws 9 and 10 formed in the frame 2 such that a part of the first mounting portion 4 is inserted into the claws, as a result of which the flexible circuit board 1 is mounted and held on the frame 2. Subsequently, one end portion of the first mounting portion 4, which is opposite, in its longitudinal direction, to the other end portion hooked with the claws 9 and 10, is held at a low position with respect to the height of walls 11 and 12. Note that the number of claws enough to hook the first mounting portion 4 is provided in accordance with the size of the first mounting portion 4.

Subsequently, a part of the coupling portion 5 is hooked on the claw 13 of the frame 2 prior to mounting the connector mounting portion 6 on the frame 2. As a result, one side of the first mounting portion 4, which is opposite to the side hooked on the claws 9 and 10, could not loose out of the frame 2. Subsequently, the connector mounting portion 6 is mounted on the board 3 exposed from the frame 2, and the connector. 16 is also arranged at a predetermined position. Finally, the second mounting portion 8 is hooked on the claws 14 and 15 while being deflected. With the above-described procedure, mounting the flexible circuit board 1 on the frame 2 is completed.

As described above, the flexible circuit board 1 is folded at the bent portion 17 prior to be mounted on the frame 2, whereby the second mounting portion 8 can move freely in a certain range in its rotational direction with the rotation starting point as an axis, as shown in FIG. 6. This can reduce the force exerted in a certain direction from the previously mounted mounting portions when the flexible circuit board 1 is mounted on the electronic circuit device. Therefore, the flexible circuit board 1 can be mounted on the frame 2 easily without an excessive force exerted on the claws 9, 10, 13, 14, and 15 of the frame 2. Further, irrespective of the mounting order of the two mounting portions 4, 8 and the connector mounting portion 6 on the frame 2, the two mounting portions 4, 8 and the connector mounting portion 6 dose not deform or loose when they are being mounted on the frame 2. Moreover, the components on these mounting portions are not peeled off or damaged, which may be caused by these mounting portions bending.

Further, the flexible circuit board 1 is folded at the bent portion 17, whereby the electronic components mounted on the second mounting portion 8 and the connector 16 are arranged on the back side of the electronic components mounted on the first mounting portion 4. Thus, signal transmission can be achieved to the board 3 through the flexible circuit board 1 even if the electronic components are mounted on not both surfaces of the flexible circuit board 1 but one of the surfaces thereof. Therefore, there is no limitation on the method of mounting the electronic components on the flexible circuit board 1. Accordingly, the electronic parts can be mounted on the flexible circuit board 1 at low cost compared with the case of mounting the electronic components on both surfaces.

Here, description will be made of a provisional case of a structure in which the flexible circuit board 1 is not folded at the bent portion 17. In this case, since the first mounting portion 4 and the connector mounting portion 6, which are previously mounted on the frame 2, are fixed to the frame 2, the forces from the two directions thereof are exerted on the coupling portion 7 and the second mounting portion 8. Thus, the second mounting portion 8 can hardly be moved in a direction that connects the claw 14 with the claw 15, that is, in a longitudinal direction of the coupling portion 7, and thus, is difficult to be hooked with the claws 14 and 15. Also in this case, when the coupling portion 7 is relatively short, the second mounting portion 8 steps on a top surface of the claw 14. As a result, the second mounting portion 8 can not be inserted into the claw 14, which may lead to deformation of the claw 14. On the contrary, when the coupling portion 7 is relatively long, the claw 15 may deform in the same way. Even if the second mounting portion 8 can be hooked with the claws 14 and 15, the connector mounting portion 6 may be lifted due to deflection of the coupling portion 7 in its longitudinal direction, which may cause a connection failure.

In view of this, the flexible circuit board 1 according to this exemplary embodiment can be folded at the bent portion 17, which enables the flexible circuit board 1 to have a structure in which the second mounting portion 8 is movable in its rotational direction in a range in which the coupling portion 5 overlaps with the connector mounting portion 6. With such a structure, variation in length of the coupling portion 7 can be absorbed in some degree by moving the second mounting portion 8 with the bent portion 17 as the starting point.

Accordingly, the flexible circuit board according to this exemplary embodiment can prevent the claws 14 and 15 and the second mounting portion 8 being damaged due to the variation in length of the coupling portion 7. Also, when the flexible circuit board 1 is mounted on the frame 2, the second mounting portion 8 can be easily hooked with the claws 14 and 15 while being moved in the rotational direction with the bent portion 17 as the center. Therefore, the flexible circuit board 1 can be easily mounted on the frame 2.

Note that the reinforcing members, which are made of hard materials such as sheet-metal materials, may be bonded or fixed by using a double-sided tape or the like, to the back surface of the first or second mounting portion 4, 8 in order to obtain strength enough to prevent deformation, which may be caused when the flexible circuit board 1 is mounted on the frame 2.

Furthermore, above description has been made of the examples in which the flexible circuit board 1 according to this exemplary embodiment is folded in a two-dimensional manner to be mounted on the frame 2. However, the flexible circuit board 1 may be folded in a three-dimensional manner depending on the shape of the frame 2.

Furthermore, according to the above-described flexible circuit board, it becomes possible to easily mount the flexible circuit board on a mobile communication terminal or other electronic circuit devices that limit arrangement of the circuit board and the like, and at low cost. FIG. 1 may be a perspective view of a mobile communication terminal including the flexible circuit board.

While this invention has been described in connection with certain exemplary embodiments, it is to be understood that the subject matter encompassed by way of this invention is not to be limited to those specific embodiments. On the contrary, it is intended for the subject matter of the invention to include all alternatives, update, and equivalents as can be included within the spirit and scope of the following claims.

Further, the inventor's invention is to retain all equivalents of the claimed invention even if the claims are amended during prosecution.

What is claimed is:

1. A flexible circuit board mounted on an electronic circuit device, comprising:
   a plurality of mounting portions which are mounted with electronic circuits;
   a connector portion that performs signal transmission between the electronic circuits mounted on each of the mounting portions and the electronic circuit device;
   coupling portions that couple the mounting portions to the connector portion in different directions,
   wherein one of the mounting portions is coupled to a coupling portion including a predetermined part, and the predetermined part is provided with a notch or notches to move said one of the mounting portions in a parallel direction with respect to the other mounting portions in a state that said one of the mounting portions is bent around the predetermined part,
   wherein the coupling portion which includes the predetermined part has a longitudinal dimension longer than the longitudinal dimension of the connector portion such that when the connector portion is bent at the notch or notches of the predetermined part to a position where the longitudinal dimensions are about parallel, the connector portion does not overlap the mounting portion coupled to the coupling portion which includes the predetermined part, and
   wherein the flexible circuit board is mounted on the electronic circuit device in a state of being bent at the predetermined part.

2. The flexible circuit board according to claim 1, wherein the flexible circuit board is mounted on the electronic circuit device in a state in which the predetermined part is bent such that the electronic circuits are overlapped with each other in a two-dimensional manner.

3. The flexible circuit board according to claim 1, wherein the flexible circuit board is received in the electronic circuit device in a state in which the predetermined part is bent such that the electronic circuits are overlapped with each other in a three-dimensional manner.

4. The flexible circuit board according to claim 1, wherein reinforcing members are bonded to each of the mounting portions.

5. The flexible circuit board according to claim 1, wherein the electronic circuits are mounted only on one surface of the flexible circuit board.

6. An electronic circuit device mounted with electronic circuits using the flexible circuit board according to any one of claims 1, 2, 3, 4 and 5.

7. A mobile communication terminal mounted with electronic circuits using the flexible circuit board according to any one of claims 1, 2, 3, 4 and 5.

8. A method of mounting a flexible circuit board, comprising:
   mounting a plurality of mounting portions with electronic circuits, a connector portion that performs signal transmission between the electronic circuits mounted on each of the mounting portions and an electronic circuit device, and coupling portions that couple the mounting portions to the connector portion in different directions;
   bending the flexible circuit board at a predetermined part of one of the coupling portions wherein the coupling portion which includes the predetermined part has a longitudinal dimension longer than the longitudinal dimension of the connector portion such that when the connector portion is bent at the notch or notches of the predetermined part to a position where the longitudinal dimensions are about parallel, the connector portion does not overlap the mounting portion coupled to the coupling portion which includes the predetermined part, and
   mounting the flexible circuit board on the electronic circuit device while moving the flexible circuit board in a rotational direction thereof with the predetermined part as a starting point and moving one of said plurality of mounting portions in a parallel direction with respect to another one of said plurality of mounting portions.

9. A flexible circuit board mounted on an electronic circuit device, comprising:
   a plurality of mounting portions which are mounted with electronic circuits;
   a connector portion that performs signal transmission between the electronic circuits mounted on each of the mounting portions and the electronic circuit device; and
   coupling portions that couple the mounting portions to the connector portion in different directions,
   wherein one of the coupling portions is coupled to one of the mounting portions and includes a predetermined part being provided with a notch or notches to move said one of the mounting portions in a parallel direction with respect to the other mounting portions in a state that said one of the mounting portions is bent around the predetermined part,
   wherein the coupling portion which includes the predetermined part has a longitudinal dimension longer than the longitudinal dimension of the connector portion such that when the connector portion is bent at the notch or notches of the predetermined part to a position where the longitudinal dimensions are about parallel, the connector portion does not overlap the mounting portion coupled to the coupling portion which includes the predetermined part, and
   wherein the flexible circuit board is mounted on the electronic circuit device while said one of the mounting portions is moved in a rotational direction centering around the bent predetermined part.

* * * * *